(12) United States Patent
Jung et al.

(10) Patent No.: US 8,363,449 B2
(45) Date of Patent: *Jan. 29, 2013

(54) FLOATING SOURCE LINE ARCHITECTURE FOR NON-VOLATILE MEMORY

(75) Inventors: Chulmin Jung, Eden Prairie, MN (US); Yong Lu, Edina, MN (US); Harry Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/206,550

(22) Filed: Aug. 10, 2011

(65) Prior Publication Data

US 2011/0299323 A1 Dec. 8, 2011

Related U.S. Application Data

(63) Continuation of application No. 12/272,507, filed on Nov. 17, 2008, now Pat. No. 8,004,872.

(51) Int. Cl.
*G11C 11/00* (2006.01)
(52) U.S. Cl. .................. 365/148; 365/163
(58) Field of Classification Search .................. 365/148, 365/163, 171
See application file for complete search history.

(56) References Cited

U.S. PATENT DOCUMENTS

| 4,733,371 | A | 3/1988 | Terada et al. |
|---|---|---|---|
| 5,982,670 | A | 11/1999 | Yamashita |
| 6,178,136 | B1 | 1/2001 | Lin et al. |
| 6,584,016 | B2 | 6/2003 | Park |
| 7,408,806 | B2 | 8/2008 | Park et al. |
| 7,423,898 | B2 | 9/2008 | Tanizaki et al. |
| 2009/0323397 | A1 | 12/2009 | Kinoshita |
| 2010/0034009 | A1 | 2/2010 | Lu et al. |
| 2012/0120713 | A1* | 5/2012 | Lu et al. ................. 365/148 |

* cited by examiner

*Primary Examiner* — Vu Le
(74) *Attorney, Agent, or Firm* — Hall Estill, et al.

(57) ABSTRACT

A method and apparatus for writing data to a non-volatile memory cell, such as an STRAM memory cell or an RRAM memory cell. In some embodiments, a plurality of N non-volatile memory cells, where N is a greater than two, are connected to a common floating source line. A write circuit is adapted to program a selected memory cell of the plurality to a selected data state by passing a write current of selected magnitude through the selected memory cell and concurrently passing a portion of the write current in parallel through each of the remaining N−1 memory cells of the plurality via the common floating source line.

23 Claims, 5 Drawing Sheets

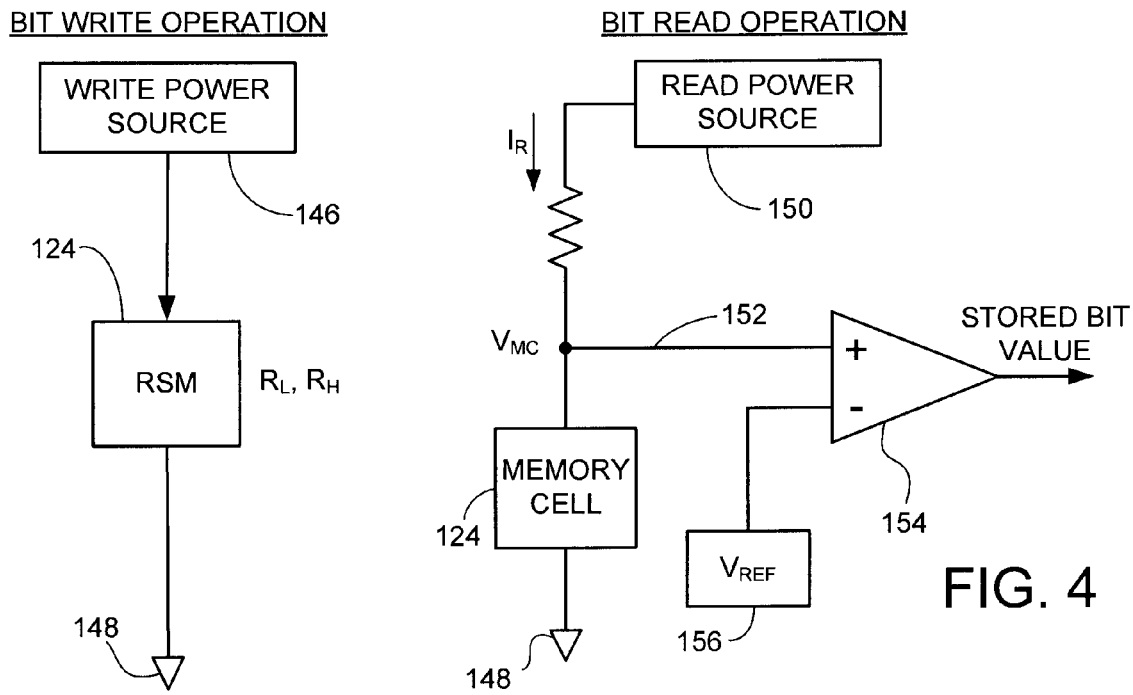
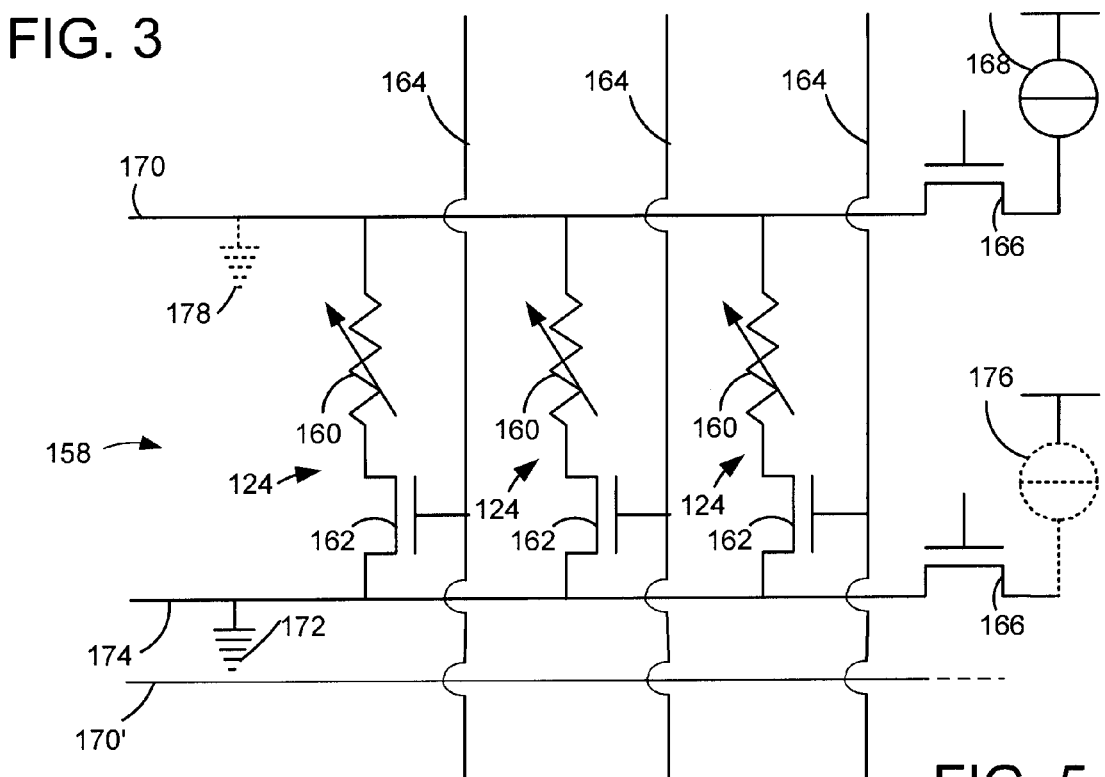

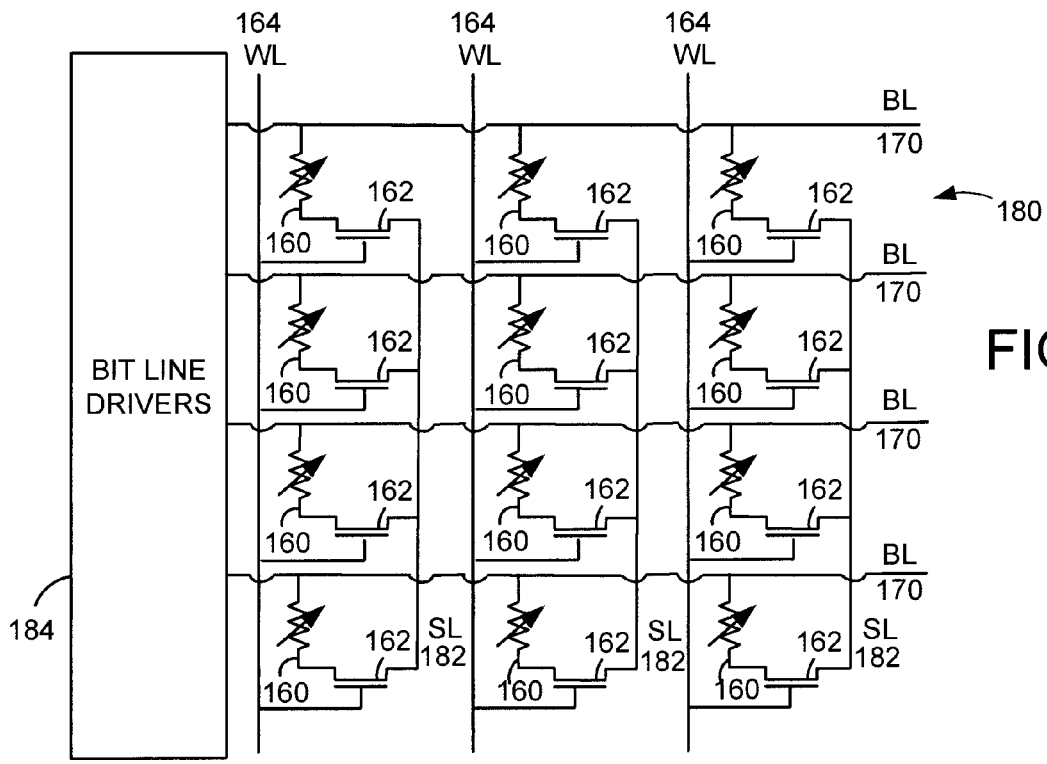
FIG. 6
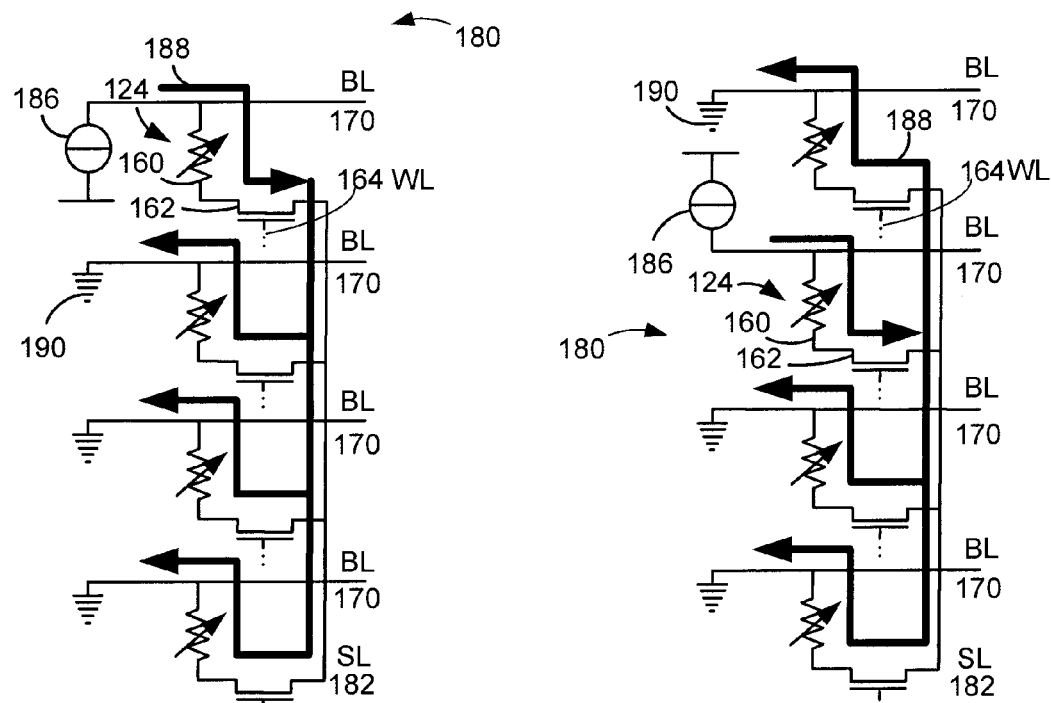
FIG. 7
FIG. 8

FLOATING SOURCE LINE ARCHITECTURE FOR NON-VOLATILE MEMORY

RELATED APPLICATION

The present application is a continuation of copending U.S. patent application Ser. No. 12/272,507 filed on Nov. 17, 2008.

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency of memory cell operation, particularly with regard to the writing data to an array of memory cells.

SUMMARY

Various embodiments of the present invention are generally directed to a method and apparatus for writing data to a non-volatile memory cell, such as but not limited to an STRAM memory cell or an RRAM memory cell.

In accordance with various embodiments, a plurality of N non-volatile memory cells, where N is a greater than two, are connected to a common floating source line. A write circuit is adapted to program a selected memory cell of the plurality to a selected data state by passing a write current of selected magnitude through the selected memory cell and concurrently passing a portion of the write current in parallel through each of the remaining N−1 memory cells of the plurality via the common floating source line.

These and various other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data can be written to a resistive sense memory of the memory array.

FIG. 4 generally illustrates a manner in which data can be read from the resistive sense memory of FIG. 3.

FIG. 5 shows a conventional memory cell array architecture.

FIG. 6 displays the memory cell array operated in accordance with various embodiments of the present invention.

FIG. 7 generally illustrates the operation of the array of FIG. 6 in accordance with various embodiments of the present invention.

FIG. 8 shows the operation of the array of FIG. 6 in accordance with various embodiments of the present invention.

DETAILED DESCRIPTION

Figure 1:
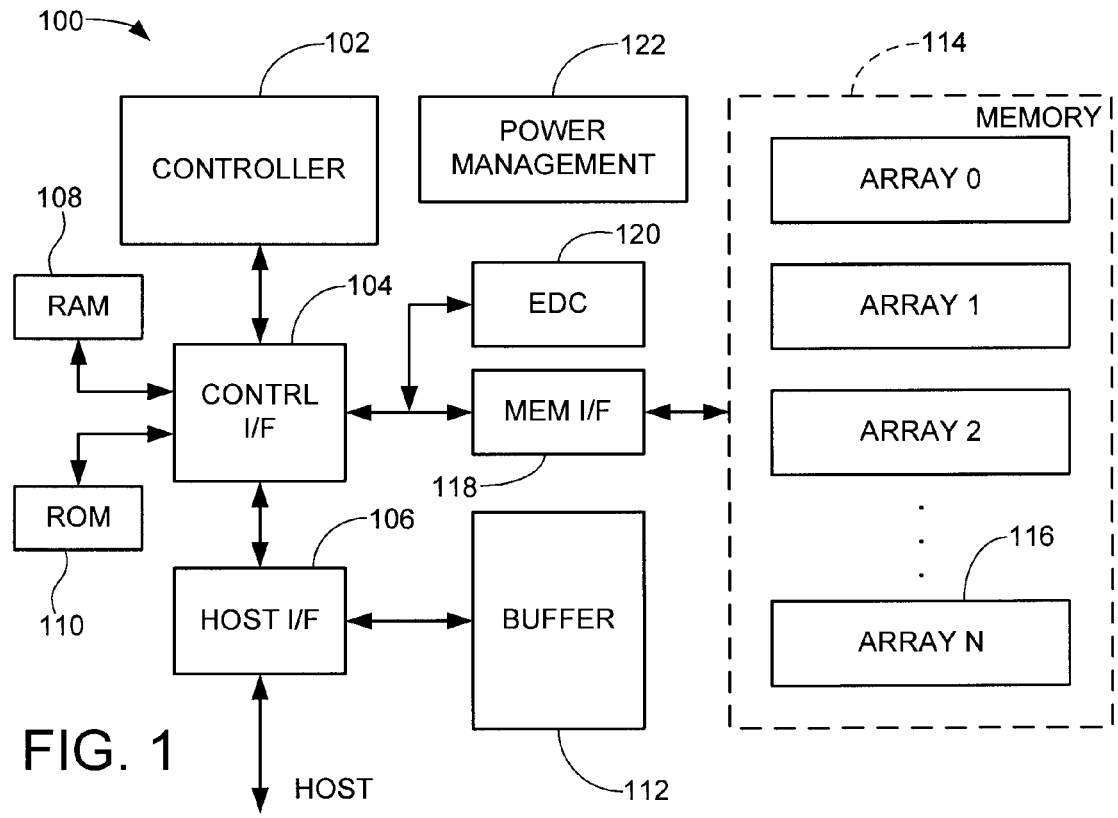
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
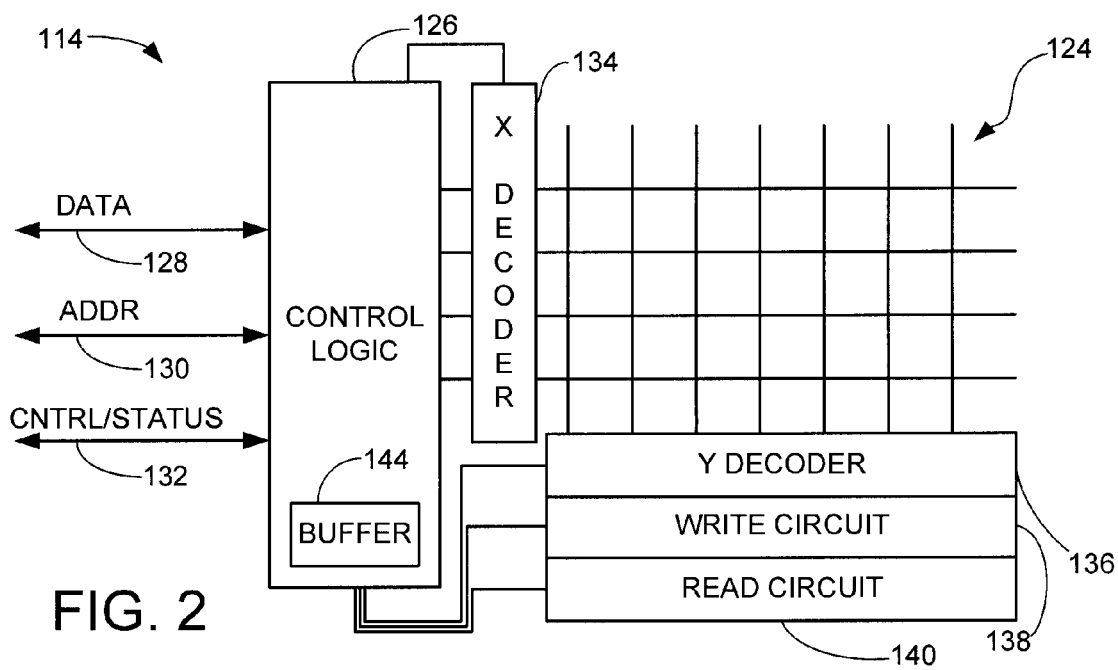
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of resistive sense memory 124, accessible by various row (word) and column (bit) lines, etc. In some embodiments, each of the array resistive sense memory 124 has magnetic random access memory (MRAM) configuration, such as a spin-torque transfer random access memory (STTRAM or STRAM) configuration.

The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective resistive sense memory 124 as generally depicted in FIG. 3. Generally, a write power source 146 applies the necessary input (such as in the form of current, voltage, magnetization, etc.) to configure the resistive sense memory 124 to a desired state. It can be appreciated that FIG. 3 is merely a representative illustration of a bit write operation. The configuration of the write power source 146, resistive sense memory 124, and reference node 148 can be suitably manipulated to allow writing of a selected logic state to each cell.

As explained below, in some embodiments the resistive sense memory 124 takes a modified STRAM configuration, in which case the write power source 146 is characterized as a current driver connected through a resistive sense memory 124 to a suitable reference node 148, such as ground. The write power source 146 provides a stream of power that is spin polarized by moving through a magnetic material in the resistive sense memory 124. The resulting rotation of the polarized spins creates a torque that changes the magnetic moment of the resistive sense memory 124.

Depending on the magnetic moment, the cell 124 may take either a relatively low resistance ($R_L$) or a relatively high resistance ($R_H$). While not limiting, exemplary $R_L$ values may be in the range of about 1000 ohms ($\Omega$) or so, whereas exemplary $R_H$ values may be in the range of about 2000$\Omega$ or so. Other resistive memory type configurations (e.g., RRAMs) are supplied with a suitable voltage or other input, but provide a much broader range of resistance values ($R_L$~100$\Omega$ and $R_H$~10M $\Omega$). These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the resistive sense memory 124. The amount of read current $I_R$ that flows through the cell 124 will be a function of the resistance of the cell ($R_L$ or $R_H$, respectively). The voltage drop across the resistive sense memory (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the resistive sense memory 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the resistive sense memory 124.

FIG. 5 illustrates an array 158 of memory cells 124 of FIG. 4 operated in accordance with various embodiments of the present invention. A plurality of resistive sense elements (RSE) 160 are each connected to a switching device 162 that is selectable by a word line 164. With the passing of a signal through the word line 164, the switching device 162 allows current to flow through the resistive sense element 160. The selection of a line transistor 166 allows current to pass from the first source 168 through the bit line 170 to the first ground 172 connected to the source line 174. However, the operation of the array 158 requires sending current through the cells 124 in either direction. Thus, the first source 168 and corresponding first ground 172 or a second source 176 attached to the source line 174 and second ground 178 connected to the bit line 170 can be selected by a controller to facilitate operation of one, or numerous, memory cells 124.

Each resistive sense element 160 and corresponding switching device 162 forms a unit cell that allows power to flow through the memory cell 124. The writing of a logic state to a memory cell 124 with a current pulse from the first source 168 creates a voltage differential between the bit line 170 and the source line 174. Further, the source line 174 and bit line 170' are configured to be physically separated to sufficiently allow proper signal transmission.

In FIG. 6, a semiconductor array 180 of memory cells operated in accordance with various embodiments of the present invention is displayed. The resistive sense element 160 and switching device 162 of FIG. 5 are connected to a bit line 170 and a floating source line 182. The floating source line 182 is connected to a number of unit cells that are attached to different bit lines 170. That is, the floating source line 182 connects an RSE 160 of a first bit line 170 with an RSE 60 of a different bit line 170. Likewise, the floating source line does not include a line transistor (166 of FIG. 5) that selects the activation of the source line 182. Further in some embodiments, the bit lines 170 are controlled by bit line drivers 184 that allow data to be written and read from the array 180.

It can be appreciated by one skilled in the art that the semiconductor array 180 allows the source line 182 to be positioned away from the bit line 170 so to not require special isolation of bit line 170 and source line 182. In addition, the configurability of the semiconductor array 180 allows for smaller layouts and increase density of unit cells. Further, the floating source line 182 has a reduced resistance due to the deletion of the line transistor 166 of FIG. 5.

The operation of the semiconductor array 180 of FIG. 6 is shown in FIG. 7 in accordance with various embodiments of the present invention. Of the various embodiments of the bit line drivers 184 of FIG. 6, a source 186 can be attached to a bit line 170 to send a write current 188 through the unit cell including an RSE 160 and a switching device 162. As the write current 188 flows through the selected memory cell 124, the write current concurrently flows through the remaining memory cells in a reverse direction. In some embodiments, the write current 188 passing through the remaining memory cells can be an equal fraction of the current flowing through the selected memory cell 124 due to the completion of the write current pathway with the connection of the non-selected bit lines 170 to ground 190. Thus, the write current 188 flows through the selected memory cell 124 with a predetermined magnitude while current passes through the non-selected remaining memory cells to ground 190 at a fractional magnitude.

It should be noted that all of the memory cells 124 connected by a floating source line 182 can be connected to ground 190 to create a write current pathway, or a localized number of memory cells 124 positioned near the selected memory cell 124 can be connected to ground 190. For example, a floating source line 182 that connects a large number of memory cells (i.e. 128), only a portion of the 128 cells positioned near the selected memory cell need to be connected to ground 190 to create a write current pathway. The requirements of the number of non-selected remaining memory cells that are connected to ground is dictated by dynamic power due to the source line capacitance and write ability.

The word line 164 is shown as a stump and dashed line in FIG. 7 (as well as FIGS. 8-10) for clarity purposes only. It should be noted that the word line 164 is continuously connected to each switching device 162 in its column.

FIG. 8 displays the semiconductor array 180 of FIG. 6 operated in accordance with various embodiments of the present invention. The source 186 sends a write current 188 through a different RSE 160 and switching device 162 (as compared to FIG. 7) at a first magnitude and simultaneously passes current through the remaining memory cells attached to different bit lines 170 at a magnitude lower than the first magnitude. Therefore, the connection of numerous bit lines 170 to ground 190 creates the write current pathway that flows from the source 186 to the multiple grounds 190 through selected and remaining memory cells at different magnitudes. Similarly, the write current 188 passes through the selected memory cell 124 in a direction opposite the direction of the current through the remaining cells.

Figure 9:
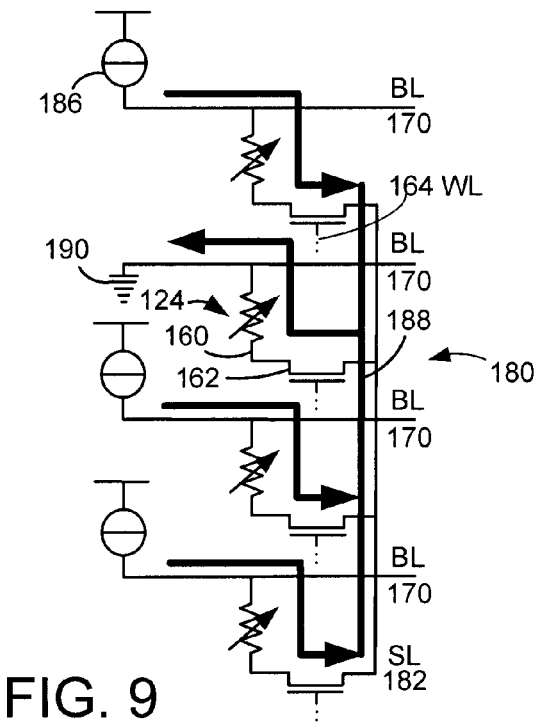
FIG. 9 displays the operation of the array of FIG. 6 in accordance with various embodiments of the present invention.

FIG. 9 shows the semiconductor array 180 of FIG. 6 operated in accordance with various embodiments of the present invention. To flow the write current 188 through the selected memory cell 124 in an opposing direction, the bit line 170 connected to the selected memory cell 124 is attached to a ground 190 while the remaining cells are connected to sources 186. The sources 186 will send a write current 188 through the connected RSE 160 and switching device 162 in a first direction and at a magnitude that is a fraction of the current needed to write a logical state to the selected memory cell 124. Thus, the write current that passes through the RSE 160 of the remaining memory cells is not enough to write a logical state, but the aggregate current flowing through the selected memory cell 124 is enough to set the RSE 160 to a predetermined resistance state and corresponding logical state.

Figure 10:
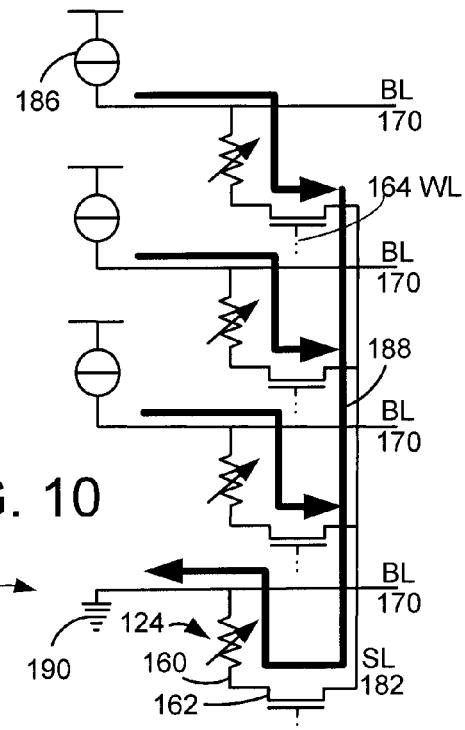
FIG. 10 shows the operation of the array of FIG. 6 in accordance with various embodiments of the present invention.

FIG. 10 displays the semiconductor array 180 of FIG. 6 operated in accordance with various embodiments of the present invention. Multiple bit lines 170 are connected to sources 186 that send a write current through a different RSE 160 and switching device 162 (as compared to FIG. 9) attached to each bit line 170 concurrently. The write current 188 from each source 186 is combined and passed through the switching device 162 and RSE 160 in a direction opposite from the direction the write current passed through bit lines 170 connected to a source 186. Similarly to FIG. 9, the write current 188 experienced by the RSE 160 connected to a source 186 is a fraction of the current necessary to switch the resistive state and logical state of the RSE 160. However, the combination of the multiple small write currents 188 from the multiple sources aggregate to a current large enough to set a predetermined resistance state and logical state to the RSE 160.

Figure 11:
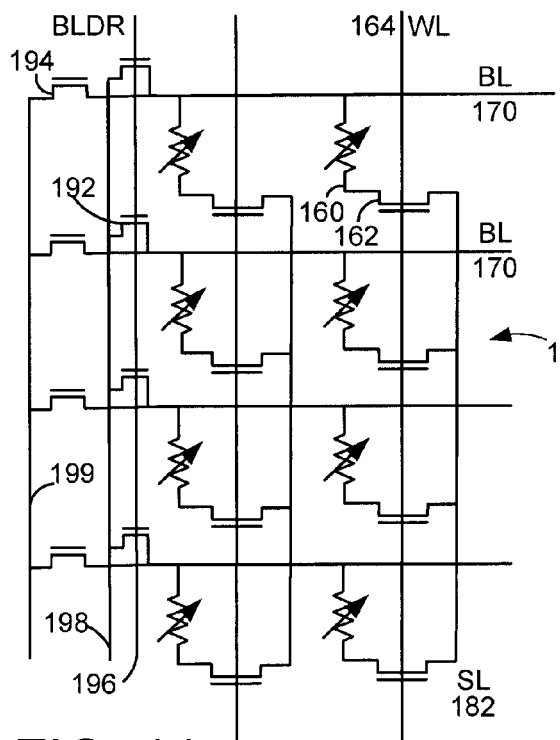
FIG. 11 generally illustrates an array of memory cells operated in accordance with various embodiments of the present invention.

FIG. 11 shows the semiconductor array 180 of FIG. 6 operated in accordance with various embodiments of the present invention. In some embodiments of the bit line drivers 184 of FIG. 6, a bleeder transistor 192 and a data transistor 194 are connected to each bit line 170. Further, the bleeder transistor 192 of each bit line 170 is connected by a bleeder line 196 that allow for selection of the bleeder transistors. While the drain of the bleeder transistor 192 is connected to each bit line 170, the source of the bleeder transistor is connected to a data line 198. A reverse data line 199 which has a reverse polarity is connected to the source of the data transistor 194.

During operation, the gates of the bleeder transistors 192 remain selected. The data transistor 194 has a wider gate and stronger drivability than the bleeder transistor 192. When one of the data transistors 194 is on, it receives the strength of the bleeder transistor 192. Finally, the data transistor 194 drives a signal in a reverse direction of the bleeder transistors 192 and achieves the operation illustrated in FIGS. 9 and 10.

Figure 12:
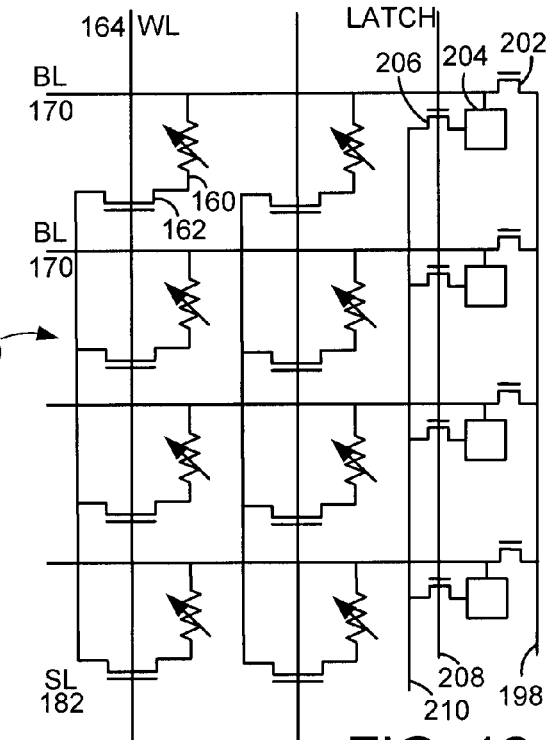
FIG. 12 shows an array of memory cells operated in accordance with various embodiments of the present invention.

FIG. 12 displays the semiconductor array 180 of FIG. 6 operated in accordance with various embodiments of the present invention. In some embodiments of the bit line drivers 184 of FIG. 6, a data transistor 202 is connected to each bit line 170 in the array 180 and a data line 198. A latch 204 is also connected to each bit line 170 as well as a latch transistor 206. The gate of each latch transistor 206 of the array 180 is connected by a latch line 208 to allow selection. Further, the source of the latch transistor 206 is connected to a secondary data line 210. This configuration of bit line 170 drivers allows for numerous inputs and controls for the signal that is sent to the various RSE 160 of the array 180.

The use of a latch 204 instead of the bleeder transistor 192 provides an ability change the status of the latch 204. Accordingly, once a data transistor 202 is on, it competes with the small latch's 204 strength and eventually changes to signal direction towards the data lines 198. The latch 204 does not lose current after the change of direction due to the latch 204 changing to the direction of the data lines 198.

Figure 13:
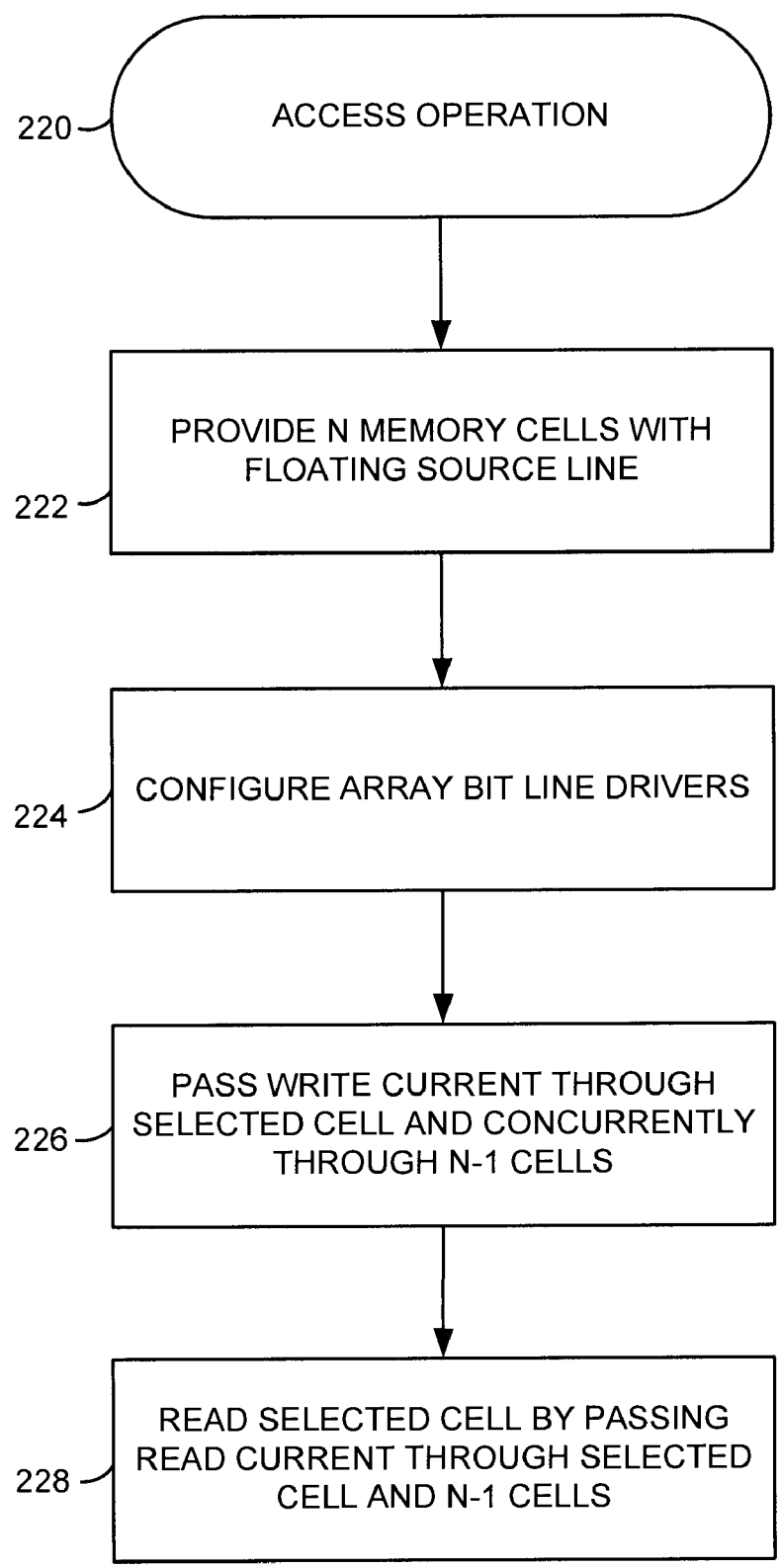
FIG. 13 shows a flow diagram for an access operation performed in accordance with the various embodiments of the present invention.

FIG. 13 shows a flow diagram of an exemplary access operation routine 220 performed in accordance with the various embodiments of the present invention. The routine 220 begins at step 222 with providing an N number of memory cells 124 that are connected by a common floating source line 182. In some embodiments, the memory cells 124 are attached to different bit lines 170 that make up a semiconductor array 180. In step 224, the bit line drivers 184 are configured to create a write current pathway that allows a write current 188 to flow through a selected RSE 160. Once a write current is passed through the selected RSE 160 in step 226, a fractional division of the write current 188 will concurrently flow through N−1 or less memory cells 124. The resistance state and logical state of the selected memory cell 124 is read by passing a read current through the selected cell and concurrently through N−1 or less memory cells 124 at step 228. In various embodiments of the present invention, the read current is a lower magnitude than the current required to set the resistance and logical states of the memory cell. Likewise, the passing of read current through the selected cell can be conducted in the absence of step 226. For example, a read current can be passed through the memory cells 124 without having an immediately prior write current passing through the selected cell.

As can be appreciated by one skilled in the art, the various embodiments illustrated herein provide advantages in both memory cell efficiency and reliability due to the increased density potential and increased simplicity of reading and writing memory cells. The utilization of improved resistance characteristics in the floating source line design improves accuracy of writing data. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A solid-state memory comprising:
a plurality of N non-volatile memory cells where N is greater than two, each memory cell connected to a common floating source line; and
a write circuit adapted to program a selected memory cell of said plurality to a selected data state by passing a write current of selected magnitude through the selected memory cell and concurrently passing a portion of the write current in parallel through each of the remaining N−1 memory cells of said plurality via said common floating source line.

2. The solid-state memory of claim 1, in which each of the plurality of memory cells is further connected to a separate bit line, wherein during said programming of the selected memory cell, the bit line connected to the selected memory cell is held by the write circuit at a first voltage potential and the remaining bit lines respectively connected to the remaining N−1 memory cells held at a common second voltage potential.

3. The solid-state memory of claim 2, in which the first voltage potential is greater than the second voltage potential.

4. The solid-state memory of claim 1, in which the common floating source line is not connected to a ground terminal or switching transistor.

5. The solid-state memory of claim 1, in which each of the plurality of N non-volatile memory cells comprises a programmable resistive sense element (RSE) connected in series with a switching device between a separate bit line and the common floating source line. the write current magnitude sufficient to switch the RSE of the selected memory cell to the selected data state and insufficient to switch a programmed state of the RSEs of the remaining N−1 memory cells.

6. The solid-state memory of claim 5, in which each of the RSEs is characterized as a magnetic tunneling junction (MTJ) having a reference layer with a fixed magnetic orientation, a free layer with a programmably selectable magnetic orientation, and a tunnel barrier layer therebetween.

7. The solid-state memory of claim 5, in which each of the switching devices is characterized as a metal oxide semiconductor field effect transistor (MOSFET).

8. The solid-state memory of claim 1, in which the write current passes through the selected memory cell in a first direction and said portions of the write current that pass in parallel through each of the remaining N−1 memory cells pass in an opposing second direction.

9. A semiconductor memory device, comprising:
an array of non-volatile memory cells arranged in rows and columns;
a plurality of spaced apart floating source lines each extending along a selected row of memory cells to interconnect the memory cells along each said row;
a plurality of spaced apart bit lines each extending along a selected column of memory cells to interconnect the memory cells along each said column; and
a write circuit adapted to program a selected memory cell in the array to a selected data state by passing a write current of selected magnitude along the bit line connected to the selected memory cell, through the selected memory cell, and along the floating source line connected to the selected memory cell, wherein a portion of the write current concurrently passes from the floating source line through at least two other memory cells connected thereto and along the respective bit lines connected to said two other memory cells.

10. The semiconductor memory device of claim 9, wherein each memory cell in said array comprises a programmable resistive sense element (RSE) in series with a switching device, wherein the write current has a magnitude sufficient to switch the RSE of the selected memory cell to the selected data state, and wherein the portions of the write current that concurrently pass through the at least other two memory cells have magnitudes insufficient to affect the programmed states of the RSEs of said at least other two memory cells.

11. The semiconductor memory device of claim 10, further comprising a plurality of spaced apart word lines each extending along a selected row to interconnect the switching devices of the memory cells arranged along each said row, wherein the write circuit applies a voltage to the word line connected to the selected memory device to place each of the memory devices along the associated row into a conductive state during the application of said write current to the bit line connected to the selected memory cell.

12. The semiconductor memory device of claim 9, wherein during said programming of the selected memory cell, the bit line connected to the selected memory cell is held by the write circuit at a first voltage potential and the bit lines respectively connected to the at least two other memory cells are each held at a common second voltage potential.

13. The semiconductor memory device of claim 9, in which the first voltage potential is greater than the second voltage potential.

14. The semiconductor memory device of claim 9, in which none of the common floating source lines are connected to a ground terminal.

15. The semiconductor memory device of claim 9, in which each of the RSEs is characterized as a magnetic tunneling junction (MTJ) having a reference layer with a fixed magnetic orientation, a free layer with a programmably selectable magnetic orientation, and a tunnel barrier layer therebetween.

16. The semiconductor memory device of claim 9, in which each of the switching devices is characterized as a metal oxide semiconductor field effect transistor (MOSFET).

17. A method for writing data, comprising:
connecting a plurality of N non-volatile memory cells to a common floating source line where N is greater than two; and
programming a selected memory cell of said plurality to a selected data state by passing a write current of selected magnitude through the selected memory cell and concurrently passing a portion of the write current in parallel through each of the remaining N−1 memory cells of said plurality via said common floating source line.

18. The method of claim 17, in which the connecting step further comprises connecting each of the plurality of memory cells to a separate bit line, and in which the programming step comprises applying a first voltage potential to the bit line connected to the selected memory cell and concurrently applying a common second voltage potential lower than the first potential to the bit lines connected to each of the remaining N−1 memory cells.

19. The method of claim 17, in which the common floating source line is not connected to a ground terminal or switching transistor.

20. The method of claim 17, in which each of the plurality of memory cells comprises a resistive sense element (RSE) in series with a switching device, each of the RSEs characterized as a magnetic tunneling junction (MU) having a reference layer with a fixed magnetic orientation, a free layer with a programmably selectable magnetic orientation, and a tunnel barrier layer therebetween, each of the switching devices characterized as a metal oxide semiconductor field effect transistor (MOSFET).

21. The solid state memory of claim 1, in which each of the N memory cells comprises a resistive random access memory (RRAM) cell.

22. The semiconductor memory device of claim 9, in which each of the memory cells in the array is a resistive random access memory (RRAM) cell.

23. The method of claim 17, in which the plurality of N non-volatile memory cells are resistive random access memory (RRAM) cells.

* * * * *